US011101776B2

(12) United States Patent
Mathew et al.

(10) Patent No.: US 11,101,776 B2
(45) Date of Patent: Aug. 24, 2021

(54) COMMON SOURCE PREAMPLIFIER FOR A MEMS CAPACITIVE SENSOR

(71) Applicant: CIREL SYSTEMS PRIVATE LIMITED, Bangalore (IN)

(72) Inventors: Rinu Mathew, Calicut (IN); Leela Madhav Lakkimsetti, Bangalore (IN)

(73) Assignee: CIREL SYSTEMS PRIVATE LIMITED, Bangalore (IN)

( * ) Notice: Subject to any disclaimer, the term of this patent is extended or adjusted under 35 U.S.C. 154(b) by 134 days.

(21) Appl. No.: 16/430,119

(22) Filed: Jun. 3, 2019

(65) Prior Publication Data

US 2020/0321921 A1    Oct. 8, 2020

(30) Foreign Application Priority Data

Apr. 2, 2019 (IN) .............................. 201941013237

(51) Int. Cl.
*H03F 1/34* (2006.01)
*H03F 3/45* (2006.01)
*H03F 1/30* (2006.01)
*G01L 9/12* (2006.01)

(52) U.S. Cl.
CPC ............ *H03F 1/342* (2013.01); *H03F 1/301* (2013.01); *H03F 3/45179* (2013.01); *G01L 9/12* (2013.01); *H03F 2200/03* (2013.01); *H03F 2200/129* (2013.01); *H03F 2200/228* (2013.01); *H03F 2200/294* (2013.01); *H03F 2200/75* (2013.01); *H03F 2203/45512* (2013.01)

(58) Field of Classification Search
CPC ...... H03F 1/342; H03F 3/45179; H03F 1/301; H03F 2200/228; H03F 2203/45512; H03F 2200/294; H03F 2200/03; H03F 2200/75; H03F 2200/129; H03F 3/3022; H03F 3/345; H03F 1/26; H03F 2200/456; H03F 3/183; G01L 9/12
USPC ...................... 330/1, 277, 127; 381/113, 174
See application file for complete search history.

(56) References Cited

U.S. PATENT DOCUMENTS

2015/0131813 A1* 5/2015 Kim ...................... H03F 1/0266
381/119

* cited by examiner

Primary Examiner — Hieu P Nguyen
(74) Attorney, Agent, or Firm — Maschoff Brennan

(57) ABSTRACT

A common source preamplifier for a MEMS capacitive sensor is disclosed. The preamplifier is a single-stage amplifier employing negative feedback. The preamplifier provides stable gain independent of temperature and at the same time provides effective buffering for a subsequent stage. Further, the preamplifier may be configured to provide different values of gain. Furthermore, the preamplifier has lower noise and consumes lesser area and lesser power than prior art.

4 Claims, 8 Drawing Sheets

COMMON SOURCE PREAMPLIFIER FOR A MEMS CAPACITIVE SENSOR

FIELD OF INVENTION

The present disclosure relates to a low noise, low power preamplifier circuit for a MEMS capacitive sensor.

BACKGROUND OF THE INVENTION

MEMS capacitive sensors are capacitors fabricated as Micro-Electromechanical Structures (MEMS), for converting a mechanical movement into an electrical signal. MEMS capacitive sensors find utility in various applications. For example, a MEMS capacitive microphone employs a MEMS capacitive sensor for converting pressure signals resulting from speech, to a voltage signal. The voltage signal at the output of such MEMS capacitive microphones are of low amplitude. Therefore, amplifiers with extremely low-noise characteristics are required so as to amplify the low amplitude signals. Further, the MEMS capacitive sensors also have a high output impedance. Therefore, preamplifiers with a low input leakage are typically used to buffer the next stage and/or increase the gain of the signal.

In existing art, preamplifiers are realized using operational amplifiers. However, such preamplifiers have large flicker noise characteristics due to the presence of multiple MOSFETS inside the operational amplifiers. Further, the use of operational amplifiers consumes large amount of power and requires larger silicon area for implementation.

In another existing art, a preamplifier is realized using a source follower circuit. Such preamplifiers achieve gain functionality using positive feedback through capacitors. However, the positive feedback causes the gain of the preamplifier to vary drastically with change in the ambient temperature.

BRIEF SUMMARY OF THE INVENTION

This summary is provided to introduce a selection of concepts in a simple manner that is further described in the detailed description of the disclosure. This summary is not intended to identify key or essential inventive concepts of the subject matter nor is it intended for determining the scope of the disclosure.

An example of a preamplifier circuit for a Micro Electro Mechanical Systems (MEMS) capacitive sensor is disclosed. The preamplifier circuit comprises a charge pump. The preamplifier circuit further comprises a charge pump filter resistor connected between the charge pump and a bias node of the MEMS capacitive sensor, for biasing the MEMS capacitive sensor. The preamplifier circuit further comprises a first N-MOSFET connected in common source configuration, for amplifying an output signal of the MEMS capacitive sensor. The preamplifier circuit further comprises a negative feedback loop for gain control, consisting of a first capacitor and a second capacitor. The first capacitor is connected between drain of a first N-MOSFET and the bias node of the MEMS capacitive sensor, and the second capacitor is connected between the bias node of the MEMS capacitive sensor and a source terminal of the first N-MOSFET, to set the gain of the preamplifier circuit greater than one. The preamplifier circuit further comprises a first current source connected to a drain terminal of the first N-MOSFET. The preamplifier circuit further comprises a first biasing resistor connected between the first current source and a gate terminal of the first N-MOSFET for providing a negative feedback loop for the first N-MOSFET, to maintain the first N-MOSFET in saturation. The gain of the preamplifier circuit in this exemplary embodiment depends on the ratio of capacitance of the first capacitor and capacitance of the second capacitor and is always greater than one.

Another example of a preamplifier circuit for a MEMS capacitive sensor is also disclosed. The preamplifier circuit comprises a charge pump. The preamplifier circuit further comprises a charge pump filter resistor connected between the charge pump and a bias node of the MEMS capacitive sensor, for biasing the MEMS capacitive sensor; a first N-MOSFET connected in common source configuration, for amplifying an output signal of the MEMS capacitive sensor. The preamplifier circuit further comprises a negative feedback loop for gain control, consisting of a first capacitor and a second capacitor. The first capacitor is connected between drain of a first N-MOSFET and a gate terminal of the first N-MOSFET, and the second capacitor is connected between the bias node of the MEMS capacitive sensor and a source terminal of the first N-MOSFET, to set the gain of the preamplifier circuit. The preamplifier circuit further comprises a first current source connected to a drain terminal of the first N-MOSFET. The preamplifier circuit further comprises a first biasing resistor connected between the first current source and the gate terminal of the first N-MOSFET for providing a negative feedback loop for the first N-MOSFET, to maintain the first N-MOSFET in saturation. The gain of the preamplifier circuit in this exemplary embodiment is determined by the capacitance of the first capacitor and a series combination of capacitance associated with the MEMS capacitive sensor and the second capacitor. Further, the preamplifier circuit disclosed in this exemplary embodiment may give a gain less than one.

Yet another example of a preamplifier circuit for a Micro Electro Mechanical Systems (MEMS) capacitive sensor, with a gate voltage compensation circuit is also disclosed. The preamplifier circuit comprises a charge pump. The preamplifier circuit further comprises a charge pump filter resistor connected between the charge pump and bias node of the MEMS capacitive sensor, for biasing the MEMS capacitive sensor; a first N-MOSFET connected in common source configuration, for amplifying an output signal of the MEMS capacitive sensor. The preamplifier circuit further comprises a negative feedback loop for gain control, consisting of a first capacitor and a second capacitor. The first capacitor is connected between drain of a first N-MOSFET and the bias node of the MEMS capacitive sensor, and the second capacitor is connected between the bias node of the MEMS capacitive sensor and a source terminal of the first N-MOSFET, to set the gain of the preamplifier circuit greater than one. The preamplifier circuit further comprises a first current source connected to a drain terminal of the first N-MOSFET. The preamplifier circuit further comprises a gate voltage compensation circuit for eliminating dependence of a voltage at the drain terminal of the N-MOSFET, on temperature and process gradients across the silicon die of the N-MOSFET. The gate voltage compensation circuit comprises a plurality of second current sources and current sinks for establishing a current flow through the first N-MOSFET. The gate voltage compensation circuit further comprises a second N-MOSFET designed to carry a current proportional to the current carried by the first N-MOSFET, wherein the second N-MOSFET is a scaled-down version of the first N-MOSFET. The gate voltage compensation circuit further comprises a first resistor and a second resistor for establishing the voltage at the drain terminal of the first N-MOSFET. The gate voltage compensation circuit further comprises a first biasing resistor connected between the second resistor and a gate terminal of first N-MOSFET, wherein the resistance of the first biasing resistor is high compared to the second resistor. The first biasing resistor and total or effective capacitance at the gate terminal of first N-MOSFET act as a low pass filter, having a cutoff frequency low enough to avoid interference of the gate voltage compensation circuit in the audio frequency range. The preamplifier circuit further comprises an output buffer for buffering the voltage at the drain terminal of the first N-MOSFET.

To further clarify advantages and features of the present disclosure, a more particular description of the disclosure will be rendered by reference to specific embodiments thereof, which is illustrated in the appended figures. It is to be appreciated that these figures depict only typical embodiments of the disclosure and are therefore not to be considered limiting of its scope. The disclosure will be described and explained with additional specificity and detail with the accompanying figures.

BRIEF DESCRIPTION OF THE FIGURES

The disclosure will be described and explained with additional specificity and detail with the accompanying figures in which.

Further, persons skilled in the art to which this disclosure belongs will appreciate that elements in the figures are illustrated for simplicity and may not have been necessarily drawn to scale. Furthermore, in terms of the construction of the circuit, one or more components of the circuit may have been represented in the figures by conventional symbols, and the figures may show only those specific details that are pertinent to understanding the embodiments of the present disclosure so as not to obscure the figures with details that will be readily apparent to those of ordinary skill in the art having benefit of the description herein.

DESCRIPTION OF THE INVENTION

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications to the disclosure, and such further applications of the principles of the disclosure as described herein being contemplated as would normally occur to one skilled in the art to which the disclosure relates are deemed to be a part of this disclosure.

It will be understood by those skilled in the art that the foregoing general description and the following detailed description are exemplary and explanatory of the disclosure and are not intended to be restrictive thereof.

In the present disclosure, relational terms such as first and second, and the like, may be used to distinguish one entity from the other, without necessarily implying any actual relationship or order between such entities.

The terms "comprises", "comprising", or any other variations thereof, are intended to cover a non-exclusive inclusion, such that a process or method that comprises a list of steps does not include only those steps but may include other steps not expressly listed or inherent to such a process or a method. Similarly, one or more circuits or sub-circuits or elements or structures or components preceded by "comprises . . . a" does not, without more constraints, preclude the existence of other circuits, other sub-circuits, other elements, other structures, other components, additional devices, additional sub-circuits, additional elements, additional structures, or additional components. Appearances of the phrase "in an embodiment", "in another embodiment" and similar language throughout this specification may, but do not necessarily, all refer to the same embodiment.

Unless otherwise defined, all technical and scientific terms used herein have the same meaning as commonly understood by one of ordinary skill in the art to which this disclosure belongs. The circuits, methods, and examples provided herein are illustrative only and not intended to be limiting.

Figure 1:
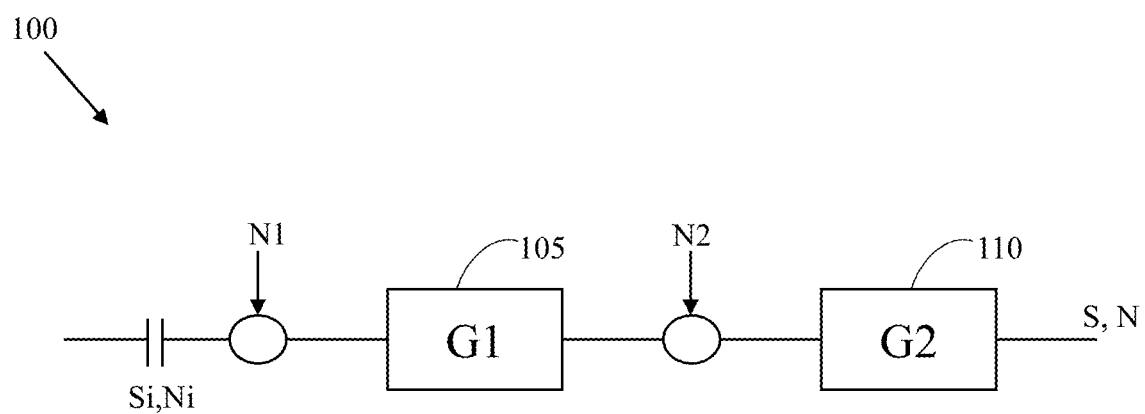
FIG. 1 illustrates a system, comprising a first amplification stage and a second amplification stage.

The present disclosure discloses a preamplifier circuit for a MEMS capacitive sensor. The preamplifier circuit disclosed overcomes the disadvantages associated with existing preamplifiers for MEMS capacitive sensors. The preamplifier circuit disclosed herein is a single stage amplifier which uses negative feedback. As a result, the preamplifier circuit provides a stable gain for amplifying the output of the MEMS capacitive sensor. Further, the preamplifier circuit also provides buffering of the signal at the output of the MEMS capacitive sensor. In addition, increasing the gain of the preamplifier circuit helps in improving the signal to noise ratio at the output of the next stage. For example, consider a system 100 comprising a first stage 105 of gain G1 and a second stage 110 of gain G2 as shown in FIG. 1. In one example, the first stage 105 may be the preamplifier and the second stage 110 may be a power amplifier. The input signal to the system 100, i.e., the signal from the MEMS capacitive sensor may be denoted as Si and the noise in the input signal Si is Ni. Further, a noise N1 may be added to Si in the first stage 105. Similarly, noise N2 may be added to the input of the second stage 110. Now, the output signal S of the system 100 may be written as:

$$S = G_1 G_2 S_i \quad (1)$$

Further, noise N in the output signal S may be written as:

$$N = N_i G_1 G_2 + N_1 G_1 G_2 + N_2 G_2 \quad (2)$$

Therefore, the signal-to-noise ratio may be written as:

$$S/N = S_i / (N_i + N1 + N2/G1) \quad (3)$$

As seen from equation (3), the increase in gain G1 of the first stage 105 helps in reducing the effect of noise N2 associated with the second stage 110. In other words, controlling the gain of the preamplifier helps in controlling the effect of noise from subsequent processing stages. Further, the preamplifier disclosed employs a single-ended common-source amplification circuit. As a result, the flicker noise contributed by MOSFETs is also less, when compared to operational amplifiers that have a differential input.

Embodiments of the present disclosure will be described below in detail with reference to the accompanying figures.

Figure 2A:
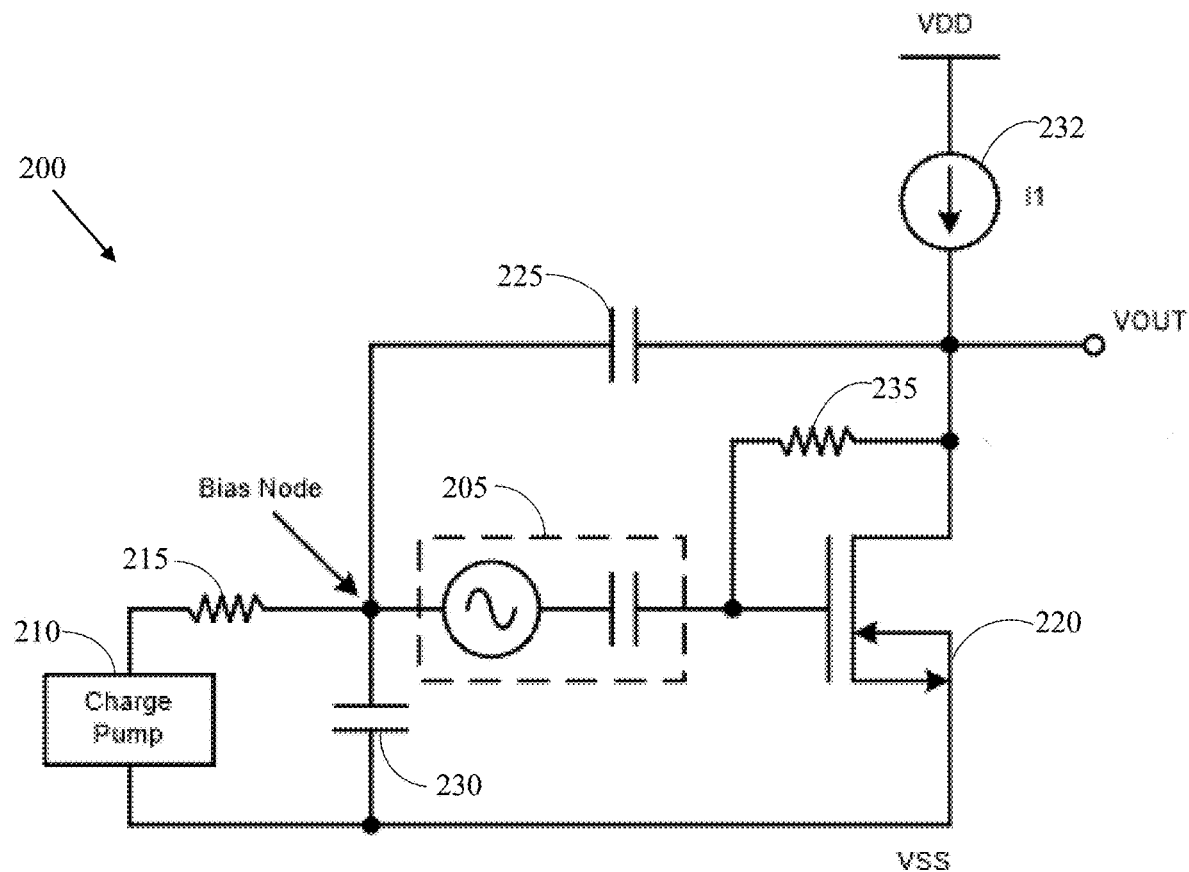
FIG. 2A illustrates a common source preamplifier circuit for a MEMS capacitive sensor, in accordance with one embodiment of the present disclosure.

Referring to FIG. 2A, a common source preamplifier circuit 200 for a MEMS capacitive sensor 205 is shown, in accordance with one embodiment of the present disclosure. In the present embodiment, the MEMS capacitive sensor 205 is modelled as a signal source in series with a capacitor. The MEMS capacitive sensor 205 is biased using a charge pump 210. In one example, the charge pump 210 may provide biasing voltages in the range of 5V to 15V. The biasing voltage is provided to a bias node associated with the MEMS capacitive sensor 205 through a charge pump filter resistor 215. In one embodiment, the charge pump filter resistor 215 is realized using anti-parallel diodes. The output of the MEMS capacitive sensor 205 is further provided to a gate terminal of an N-MOSFET 220. The pre-amplifier 200 is powered by connecting between a power supply positive terminal VDD and a power supply negative terminal $V_{SS}$ as shown in FIG. 2A. The signal provided to the gate terminal of the N-MOSFET 220 is gained up using a first capacitor 225 and a second capacitor 230. More specifically, one end of the first capacitor 225 is connected to a drain terminal of the N-MOSFET 220 and the other end is connected to the bias node. Similarly, one end of the second capacitor 230 is connected to a source terminal of the N-MOSFET 220 (i.e., to the power supply negative terminal $V_{SS}$), and the other end is connected to the bias node. The N-MOSFET 220 is biased using a current source 232 and a biasing resistor 235. The current source 232 is connected between the drain terminal of the N-MOSFET 220 and the power supply positive terminal VDD, and the biasing resistor 235 is connected between the drain terminal and the gate terminal of the N-MOSFET 220. Typically, the biasing resistor 235 has a resistance value in the range of Tera-Ohms. However, as resistors of such large values are impractical to be fabricated in an integrated circuit, the biasing resistor 235 may be realized using two anti-parallel diodes. The biasing resistor 235 causes the N-MOSFET 220 to act as a diode-connected MOSFET. Consequently, the N-MOSFET 220 is always in saturation irrespective of the current I1 from the current source 232. Further, the biasing resistor 235 and the effective capacitance (gate capacitance of N-MOSFET 220 parallel with the sensor capacitor 205 and the feedback capacitors 225 and 230) at the gate terminal of the N-MOSFET 220 form a low-pass filter having a time-constant in the order of a few seconds. Consequently, signals from MEMS capacitive sensor with frequencies lower than a few milli-Hertz are attenuated. The output voltage $V_{OUT}$ of the pre-amplifier circuit 200 is taken from the drain terminal of the N-MOSFET 220.

Assuming that the gate terminal of the N-MOSFET 220 is a virtual node, when the input voltage increases, the voltage at the virtual node tends to increase causing the output voltage $V_{OUT}$ to reduce. In other words, the virtual node is held at a constant voltage due to a negative feedback from the gate terminal of the N-MOSFET 220 to the bias node. The gain of the preamplifier circuit 200 is based on capacitance C1 of the first capacitor 225 and the capacitance C2 of the second capacitor 230, and is given by:

$$\text{Gain} = -\left(1 + \frac{C_2}{C_1}\right) \quad (4)$$

As seen from equation (4), the gain of the preamplifier circuit 200 cannot be less than one in the present embodiment.

Figure 2B:
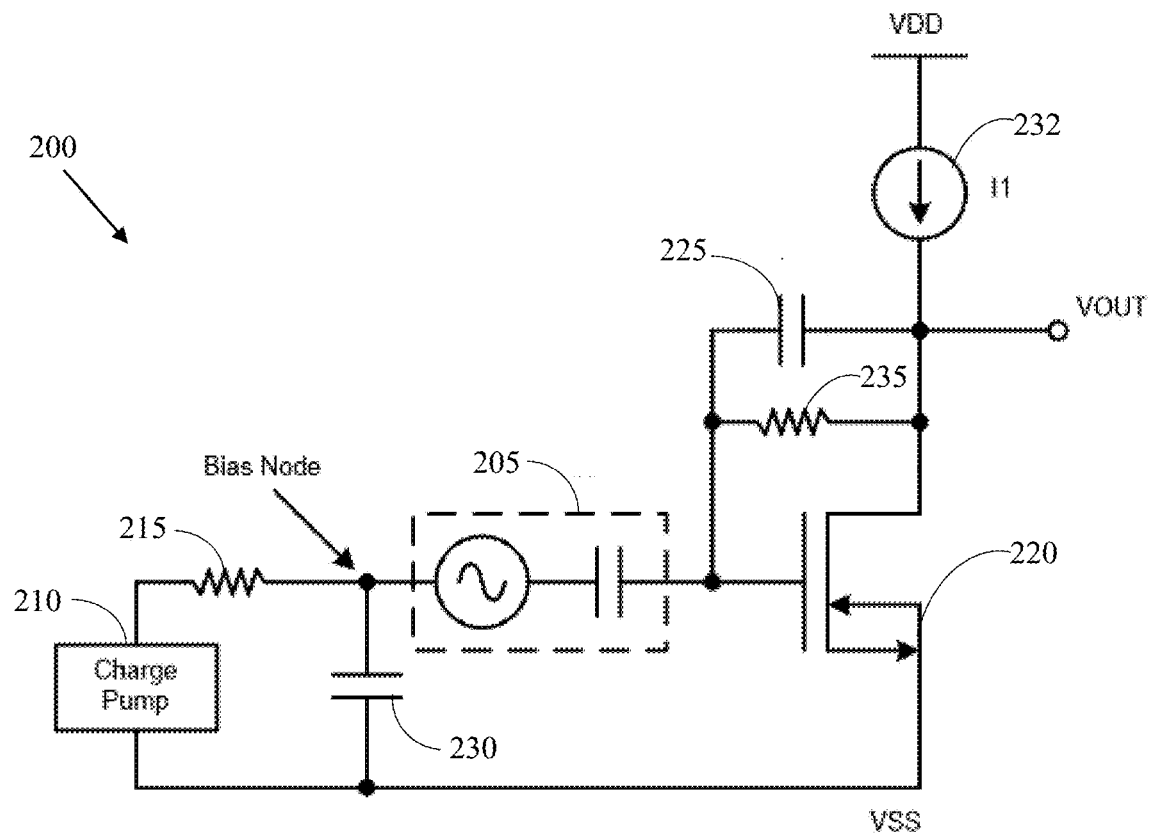
FIG. 2B illustrates a common source preamplifier circuit for a MEMS capacitive sensor, in accordance with another embodiment of the present disclosure.

In order to have gains lesser than one, the preamplifier circuit 200 may be rearranged by connecting the first capacitor 225 across the biasing resistor 235, i.e., between the virtual node and the drain terminal of the N-MOSFET 220, as shown in FIG. 2B. When the first capacitor 225 is connected across the biasing resistor 235, the gain of the preamplifier circuit 200 is based on the capacitance C1 of the first capacitor 225 and a series combination of capacitance $C_{MIC}$ associated with the MEMS capacitive sensor 205 and the capacitance C2 of the second capacitor 230, and is given by:

$$\text{Gain} = -\left(\frac{\frac{C_{MIC} \cdot C_2}{C_{MIC} + C_2}}{C_1}\right) \quad (5)$$

As seen from equation (5), the gain of the preamplifier circuit 200 may be less than one when the first capacitor 225 is connected across the biasing resistor 235. However, the connection of the first capacitor 225 across the biasing resistor 235 may cause charge flow through the MEMS capacitive sensor 205. Further, the preamplifier circuit 200 has an output common mode voltage equal to the gate voltage of the N-MOSFET 220. In other words, the common mode output voltage varies with the threshold voltage of the N-MOSFET 220. As known, the threshold voltage is dependent on temperature and process gradients across the silicon die of the N-MOSFET 220. In other words, a voltage at the drain terminal of the N-MOSFET 220 is dependent on the temperature and process gradients across the silicon die of the N-MOSFET 220. In order to compensate for the variations in the output common mode voltage, a gate voltage compensation circuit may be used, as shown in FIG. 3.

Figure 3:
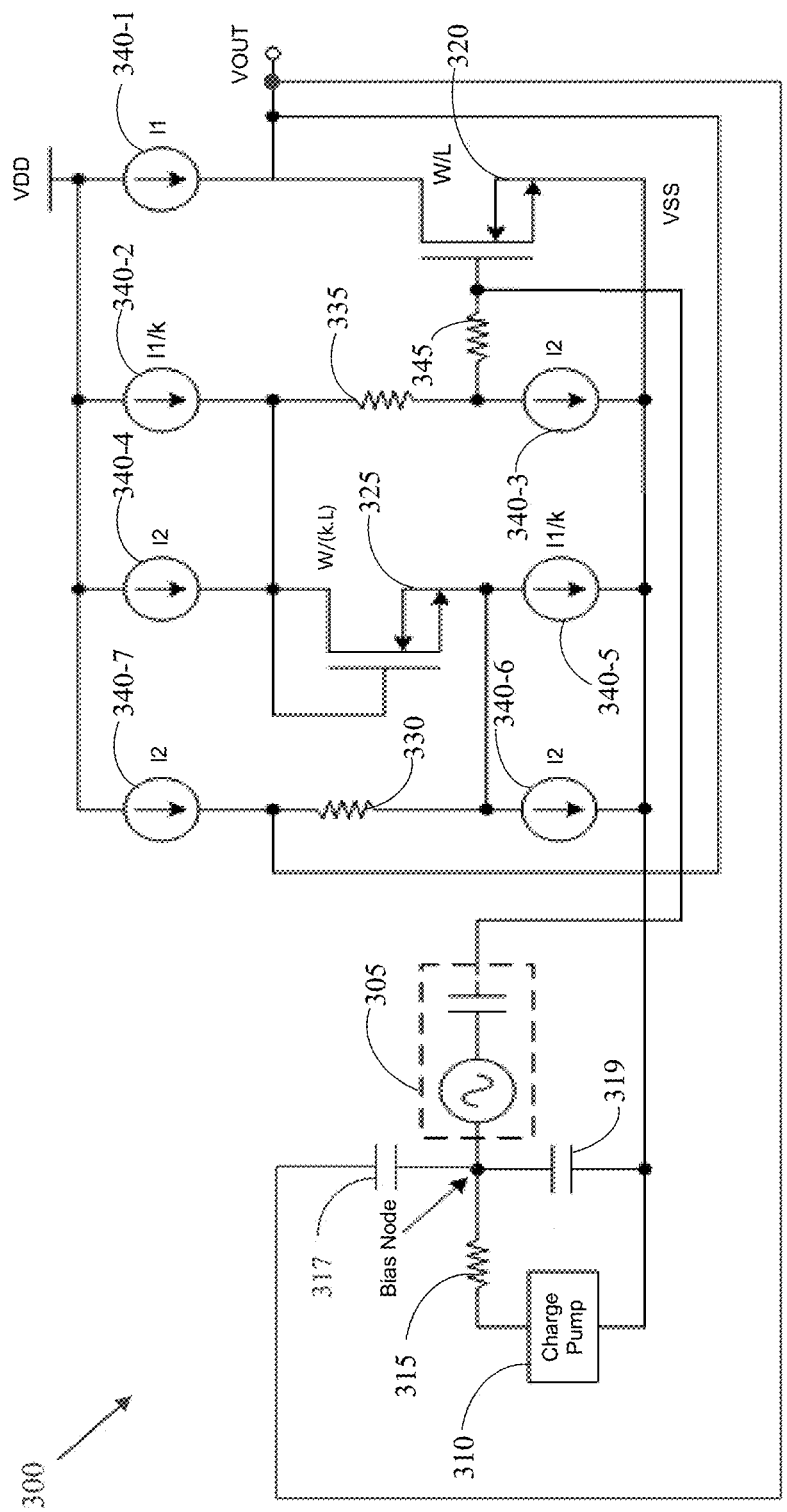
FIG. 3 illustrates a common source preamplifier circuit for a MEMS capacitive sensor, in accordance with yet another embodiment of the present disclosure.

Referring to FIG. 3, a common-source preamplifier circuit 300 for a MEMS capacitive sensor 305 is shown, in accordance with another embodiment of the present disclosure. The preamplifier circuit 300 is essentially a common-source preamplifier circuit, as shown in FIG. 2A or 2B, having a gate voltage compensation circuit.

The MEMS capacitive sensor 305 is biased using a charge pump 310. The biasing voltage is provided to a bias node associated with the MEMS capacitive sensor 305 through a charge pump filter resistor 315. The preamplifier circuit further comprises of a first capacitor 317 and a second capacitor 319 (similar to first capacitor 225 and second capacitor 230 respectively) for gaining up an output of the MEMS capacitive sensor 305. The output of the MEMS capacitive sensor 305 is further provided to a gate terminal of a first N-MOSFET 320 (similar to N-MOSFET 220). The preamplifier 300 is powered by connecting between a power supply positive terminal VDD and a power supply negative terminal $V_{SS}$.

The preamplifier circuit 300 further comprises a second N-MOSFET 325, a first resistor 330, a second resistor 335, a plurality of current sources 340-1, 340-2, 340-4, and 340-7 and a plurality of current sinks 340-3, 340-5 and 340-6 and biasing resistor 345. The second N-MOSFET 325 is scaled-down by a factor k with respect to the first N-MOSFET 320. The first N-MOSFET 320 and the second N-MOSFET 325 are matched in layout to minimize variations in a voltage at the drain terminal of the first N-MOSFET 320 resulting from temperature and process gradients across the silicon die of the first N-MOSFET 320. In one embodiment, the first resistor 330 or the second resistor 335 or both are realized using a p-type polysilicon resistor or an n-type polysilicon resistor or a combination thereof. The current source 340-1 generates a constant current I1 and is connected between the voltage source VDD and a drain terminal of the first N-MOSFET 320. The gate terminal of the first N-MOSFET 320 is connected to a first end of the biasing resistor 345. Further, the second resistor 335 is connected between a drain terminal of the second N-MOSFET 325 and a second end of the biasing resistor 345. The resistance of the biasing resistor 345 is high compared to the second resistor 335. In one example, the biasing resistor 345 may be realized using two anti-parallel diodes. Further, the biasing resistor 345 and total capacitance at the gate terminal of first N-MOSFET 320 act as a low pass filter, having a cutoff frequency low enough to avoid interferences of the gate voltage compensation circuit in the audio frequency range.

Further, the gate terminal and the drain terminal of the second N-MOSFET 325 are shorted. The current sources 340-2 and 340-4 are connected between the drain supply $V_{DD}$ and the drain terminal of the second N-MOSFET 325, and generate constant currents I1/k and current I2 respectively, where k is a constant. The current sink 340-3 sinks a constant current I2 and is connected between the second end of the biasing resistor 345 and a source terminal of the first N-MOSFET 320 (i.e., to the power supply negative terminal $V_{SS}$). The current sink 340-5 sinks a constant current I1/k and is connected between a source terminal of the second N-MOSFET 325 and the source terminal of the first N-MOSFET 320. The current sink 340-6 sinks a constant current I2 and is connected between the source terminal of the second N-MOSFET 325 and the source terminal of the first N-MOSFET 320. The current source 340-7 generates a constant current I2 and is connected between the power supply positive terminal $V_{DD}$ and the drain terminal of the first N-MOSFET 320. Further, the first resistor 330 is connected between the drain terminal of the first N-MOSFET 320 and the source terminal of the second N-MOSFET 325.

The output voltage $V_{OUT}$ measured at the drain terminal of the first N-MOSFET 320, is given by:

$$V_{OUT} = V_{GS(MN1)} + V_{R2} V_{GS(MN2)} + V_{R1} \quad (6)$$

where $V_{GS(MN1)}$ is the gate-to-source voltage of the first N-MOSFET 320, $V_{GS(MN2)}$ is the gate-to-source voltage of the second N-MOSFET 325, $V_{R1}$ is the voltage across the first resistor 330 and $V_{R2}$ is the voltage across the second resistor 335.

As the second N-MOSFET 325 is scaled-down by a factor 'k' when compared to the first N-MOSFET 320, the current flowing through the first N-MOSFET 320 is directly proportional to the current flowing through the second N-MOSFET 325. More specifically, the current I1 flowing through the first N-MOSFET 320, is k-times the current I1/k flowing through the second N-MOSFET 325. Further, the gate-to-source voltages of the first N-MOSFET 320 and the second N-MOSFET 325 are approximately equal. Consequently, the output voltage $V_{OUT}$ is dependent only on the voltages across the first resistor 330 and the second resistor 335, i.e., $$V_{OUT} = V_{R2} + V_{R1} \quad (7)$$

In other words, the effect of the output common mode voltage on the output voltage $V_{OUT}$ is compensated by using the second N-MOSFET 325. Thus, the gate voltage compensation circuit reduces dependence of the voltage at the drain terminal of the first N-MOSFET 320 on the temperature and process gradients across the silicon die of the first N-MOSFET 320, while keeping the first N-MOSFET 320 in saturation.

However, the preamplifier circuit 300 may not be able to drive a resistive load. In other words, the resistive load, loads the preamplifier circuit 300 by reducing current to first N-MOSFET 320 thus impacting the performance of the preamplifier circuit 300. To operate resistive loads with the preamplifier circuit 300, an additional output buffer stage may be used, as explained in conjunction with FIG. 4.

Figure 4:
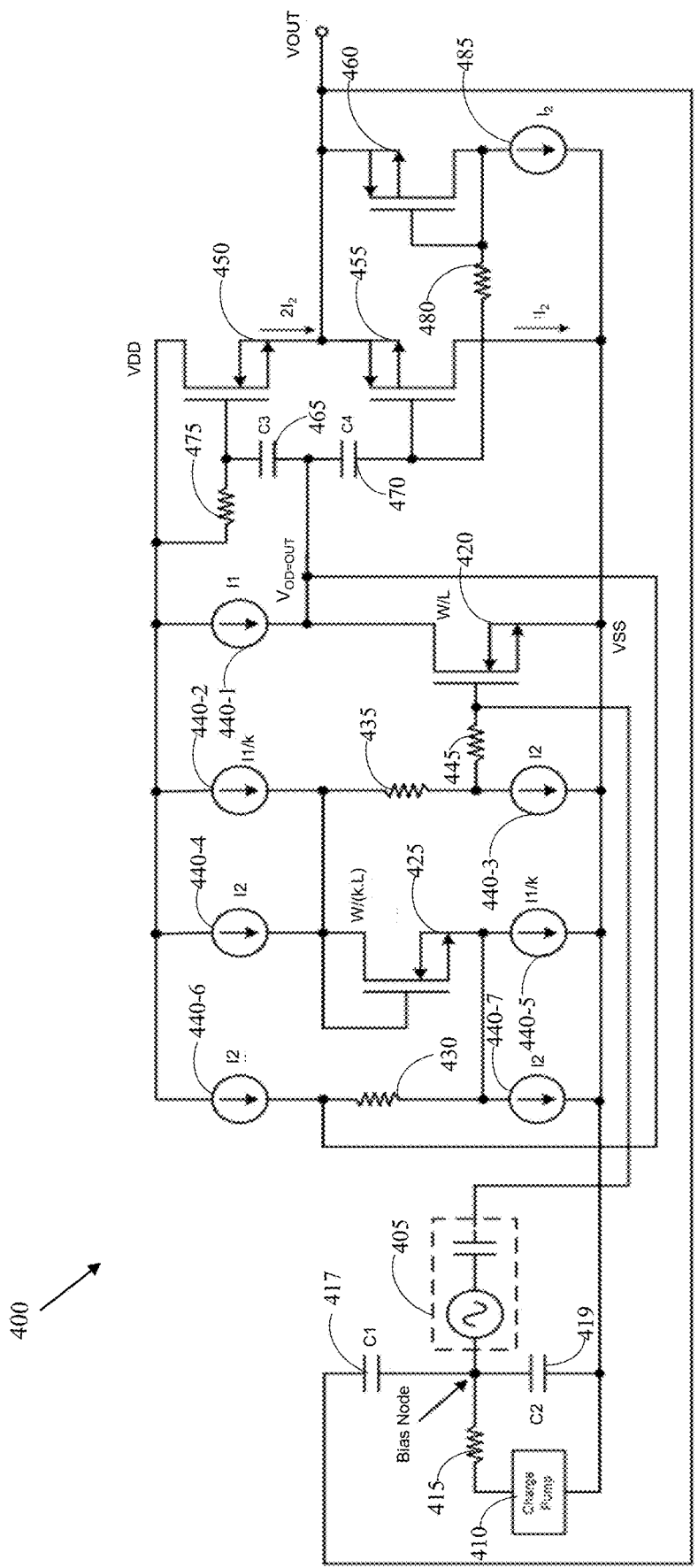
FIG. 4 illustrates a common source preamplifier circuit for a MEMS capacitive sensor, in accordance with yet another embodiment of the present disclosure.

Referring to FIG. 4, a preamplifier circuit 400 for a MEMS capacitive sensor 405 is shown, in accordance with another embodiment of the present disclosure. The preamplifier circuit 400 is essentially the preamplifier circuit 200 of FIG. 2A or 2B with an additional gate compensation circuit and an output buffer.

The MEMS capacitive sensor 405 is biased using a charge pump 410 (similar to charge pump 210). The biasing voltage is provided to a bias node associated with the MEMS capacitive sensor 405 through a charge pump filter resistor 415 (similar to charge pump filter resistor 315). The preamplifier circuit 400 further comprises a first capacitor 417 (similar to first capacitor 225) and a second capacitor 419 (similar to second capacitor 230) for gaining up an output of the MEMS capacitive sensor 405. The preamplifier circuit 400 further comprises a first N-MOSFET 420. The preamplifier 400 is powered by connecting between a power supply positive terminal VDD and a power supply negative terminal $V_{SS}$, as shown in the FIG. 4. One end of the first capacitor 417 is connected to the bias node and the other end is connected to an output node $V_{OUT}$ of the preamplifier circuit 400. Similarly, one end of the second capacitor 419 is connected to the bias node and the other end is connected to a source terminal of the first N-MOSFET 420. The first capacitor 417 and the second capacitor 419 form a negative feedback loop for gain control. In the present embodiment, the gain of the preamplifier circuit 400 is always greater than one. In another embodiment, the first capacitor 417 is connected between an output node $V_{OUT}$ of the preamplifier circuit 400 and the gate terminal of the first N-MOSFET 420 for a gain lesser than or greater than one. The output of the MEMS capacitive sensor 405 is further provided to the gate terminal of a first N-MOSFET 420 (similar to first N-MOSFET 220).

The preamplifier circuit 400 further comprises a second N-MOSFET 425 (similar to second N-MOSFET 325), a first resistor 430 (similar to first resistor 330), a second resistor 435 (similar to second resistor 335), a plurality of current sources 440-1, 440-2, 440-4, and 440-6, and current sinks 440-3, 440-5 and 440-7 (similar to current sources 340-1, 340-2, 340-4, and 340-6, and current sinks 340-3, 340-5 and 340-7 respectively) and a first biasing resistor 445 (similar to biasing resistor 345), configured for compensation of common mode output voltage in voltage $V_{CS\text{-}OUT}$ at the drain terminal of the first N-MOSFET 420. The resistance of the first biasing resistor 445 is high compared to the second resistor 435. Further, the first biasing resistor 445 and total capacitance at the gate terminal of first N-MOSFET 420 act as a low pass filter, having a cutoff frequency low enough to avoid interferences of gate voltage compensation circuit in the audio frequency range. Thus, the temperature dependence of a voltage at the drain terminal of the first N-MOS- FET 420 is reduced while keeping the first N-MOSFET 420 in saturation. The first N-MOSFET 420 and the second N-MOSFET 425 are also matched in layout to minimize variations in the voltage at the drain terminal of the first N-MOSFET 420 resulting from the temperature and process gradients across the silicon die of the first N-MOSFET 420.

The preamplifier circuit 400 further comprises a third N-MOSFET 450, a first P-MOSFET 455 and a second P-MOSFET 460 configured to act as an output buffer. The drain terminal of the third N-MOSFET 450 is connected to the power supply positive terminal VDD and a source terminal of the third N-MOSFET 450 is connected to a source terminal of the first P-MOSFET 455. Further, a drain terminal of the first P-MOSFET 455 is connected to the source terminal of the first N-MOSFET 420. The voltage $V_{CS\text{-}OUT}$ at the drain terminal of the first N-MOSFET 420 is coupled to gate terminals of the third N-MOSFET 450 and the first P-MOSFET 455 through a third capacitor 465 and a fourth capacitor 470. More specifically, a first terminal of the third capacitor 465 is connected to the gate terminal of the third N-MOSFET 450 and a second terminal of the third capacitor 465 is connected to the drain terminal of the first N-MOSFET 420. Similarly, a first terminal of the fourth capacitor 470 is connected to the gate terminal of the first P-MOSFET 455 and a second terminal of the fourth capacitor 465 is connected to the drain terminal of the first N-MOSFET 420. The gate and drain terminals of the third N-MOSFET 450 are connected to each other through a second biasing resistor 475 of high resistance in the order of Tera-Ohms. In one implementation, the second biasing resistor 475 is realized using anti-parallel diodes, for high resistance. Further, the gate terminal of the first P-MOSFET 455 is further connected to a gate terminal of the second P-MOSFET 460, through a third biasing resistor 480 of high resistance in the order of Tera-Ohms. The third N-MOSFET 450 is configured in source follower configuration. Further, a current sink 485 is connected between a drain terminal of the second P-MOSFET 460 and the source terminal of the first N-MOSFET 420, in order to generate a bias voltage for the first P-MOSFET 455. The third N-MOSFET 450 and the first P-MOSFET 455 provide a push-pull effect at the output of the preamplifier circuit 400. Consequently, the biasing current I2 required by the output buffer is less for higher loads, when compared to existing art.

The output voltage of the preamplifier circuit 400, i.e., the voltage $V_{OUT}$ at a source terminal of the second P-MOSFET 460, is further fed back to the bias node of the MEMS capacitive sensor 405 through the first capacitor 417. Consequently, noise contributed by the output buffer is suppressed by the loop gain of the preamplifier.

Figure 5A:
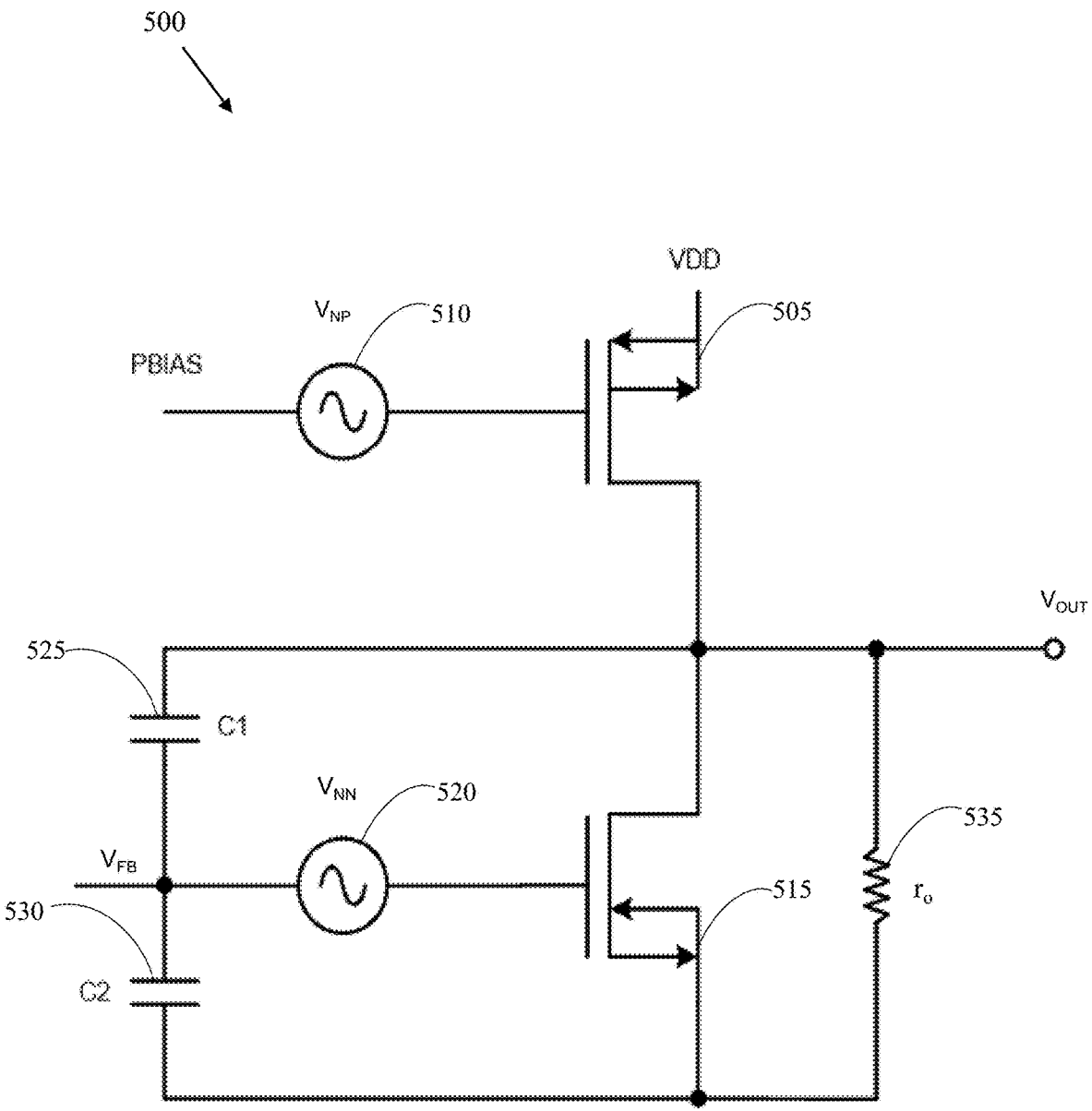
FIG. 5A illustrates an equivalent circuit for calculation of device noise in the common source preamplifier circuit, in accordance with one embodiment of the present disclosure.

Referring to FIG. 5A, a circuit 500 for calculation of device noise associated with a preamplifier is shown, in accordance with one embodiment of the present disclosure. It is to be noted that the MEMS capacitive sensor is not considered for calculation of device noise. Further, the current source 440-1 of FIG. 4 (or 340-1 of FIG. 3) is represented as a P-MOSFET 505 configured to act as a current source. The P-MOSFET 505 is biased using a DC voltage PBIAS applied to a gate terminal of the P-MOSFET 505. Further, the equivalent noise of the P-MOSFET 505 is modelled by a first voltage source 510 connected between PBIAS and the gate terminal of the P-MOSFET 505. The first voltage source 510 generates a voltage signal VNP equivalent to the noise of the P-MOSFET 505. Similarly, the equivalent device noise of an N-MOSFET 515 (the first N-MOSFET 420 of FIG. 4) is modelled as a second voltage source 520 connected between a gate terminal of the N-MOSFET 515 and the bias node. The second voltage source 520 generates a voltage signal $V_{NN}$ equivalent to the noise of the N-MOSFET 515. The bias node is at a voltage $V_{FB}$ i.e., feedback voltage from the output of the preamplifier circuit. The circuit 500 further comprises a first capacitor 525 (similar to 417) connected between the bias node and a drain terminal of the N-MOSFET 515 and a second capacitor 530 (similar to 419) connected between the bias node and a source terminal of the N-MOSFET 515. Further, an output impedance of the preamplifier circuit is modelled by a resistor 535 of resistance $r_o$, connected between the drain terminal and the source terminal of the N-MOSFET 515.

Figure 5B:
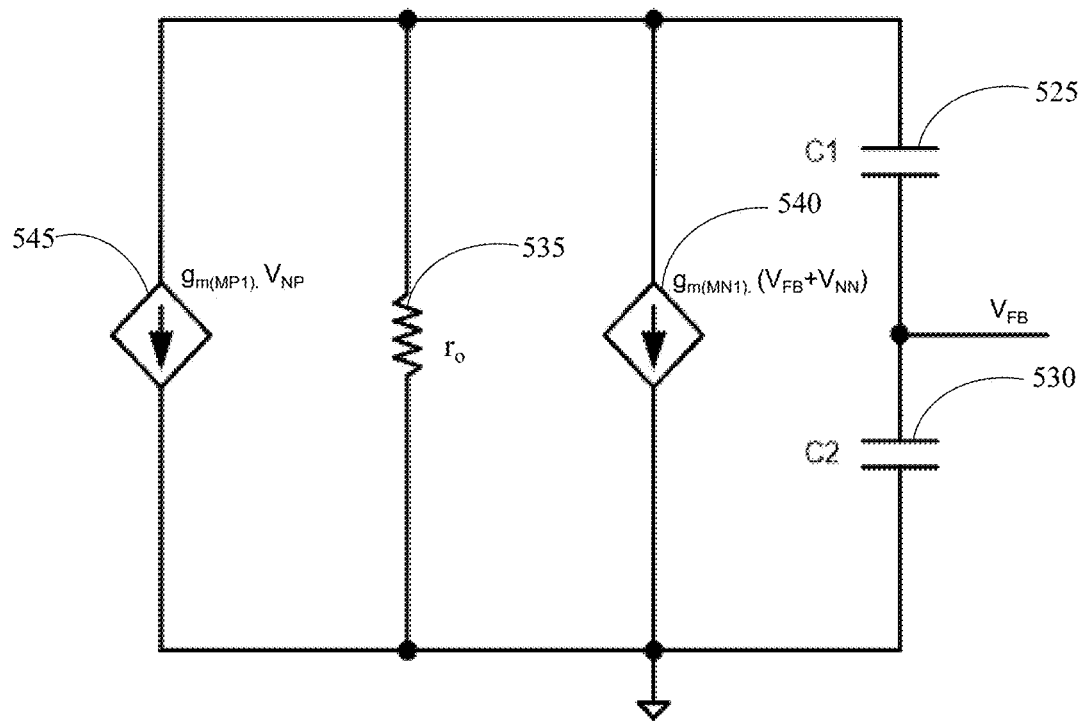
FIG. 5B illustrates a small signal equivalent circuit for calculation of device noise in the common source preamplifier circuit, in accordance with one embodiment of the present disclosure.

Referring to FIG. 5B in conjunction with FIG. 5A, a small signal model of the circuit 500 is shown, in accordance with one embodiment of the present disclosure. In the small signal model, the N-MOSFET 515 of transconductance $g_{m(MN1)}$ is modelled as an equivalent dependent current source 540 generating a current $g_{m(MN1)} \cdot (V_{FB} + V_{NN})$. Similarly, the P-MOSFET 505 of transconductance $g_{m(MP3)}$ is modelled as an equivalent dependent current source 545 generating a current $g_{m(MP3)} \cdot V_{NP}$. The N-MOSFET 515 contributes more to the noise than the P-MOSFET 505. Further, PBIAS may be filtered to reduce the noise $V_{NP}$.

Therefore, assuming that $$V_{NP} = 0 \text{ and } \left(1 + \frac{C_2}{C_1}\right) \ll g_{m(MN1)} \times r_o,$$

the noise contributed by the N-MOSFET 515 is given by:

$$V_{OUT} \approx V_{NN} \times \left(1 + \frac{C_2}{C_1}\right) \quad (8)$$

Similar, if $V_{NN}=0$, then the noise contributed by the P-MOSFET 505 is given by:

$$V_{OUT} \approx V_{NP} \times \left(1 + \frac{C_2}{C_1}\right) \times \frac{g_{m(MP3)}}{g_{m(MN1)}} \quad (9)$$

Figure 5C:
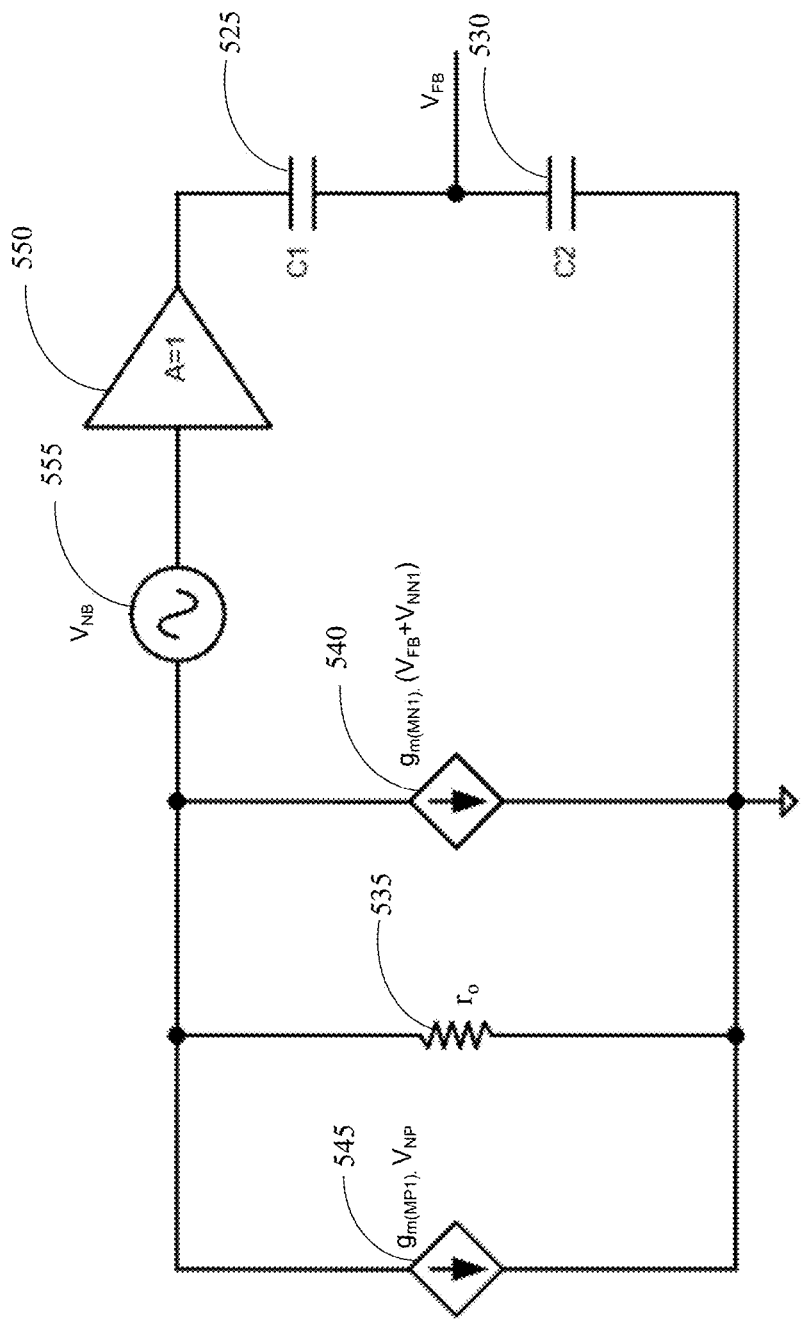
FIG. 5C illustrates a small signal equivalent circuit for calculation of device noise in the common source preamplifier circuit, in accordance with another embodiment of the present disclosure.

Now, the noise contributed by the output buffer may be calculated using the small signal model of FIG. 5C.

Referring to FIG. 5C, in conjunction with FIG. 5B, small signal model of a preamplifier circuit comprising an output buffer 550 is shown, in accordance with one embodiment of the present disclosure. The device noise associated with the output buffer 550 is modelled by a voltage source 555. The voltage source 555 generates a voltage signal $V_{NB}$ equivalent to the device noise of the output buffer 550. Assuming that $V_{NP}=0$, $V_{NN}=0$ and $$\left(1 + \frac{C_2}{C_1}\right) \ll g_{m(MN1)} \times r_o,$$

the noise contributed by the output buffer is given by:

$$V_{OUT} \approx V_{NB} \times \frac{\left(1 + \frac{C_2}{C_1}\right)}{(g_{m(MN1)} \times r_o)} \quad (10)$$

As seen, the effect of noise $V_{NB}$ is attenuated by the loop gain of the preamplifier circuit. Thus, the addition of output buffers to the preamplifier circuit of the present disclosure, does not have a significant effect on the output voltage when compared to prior art.

The preamplifier as disclosed herein, has a gain that is programmable by varying the capacitances C1 and C2 associated with the first capacitor and the second capacitor, as shown in equations (4) and (5). Further, the preamplifier is implemented as a single stage common source amplifier for amplification as well as signal buffering. Further, the area occupied by the preamplifier disclosed is also lesser compared to existing preamplifiers for MEMS capacitive sensors. Further, the power consumed by the preamplifier is also less compared to existing preamplifiers which employ positive feedback. Further, the negative feedback also enables the preamplifier to provide constant gain performance across varying temperatures. Consequently, the preamplifier, as disclosed herein, has better noise performance when compared to existing preamplifiers for MEMS capacitive sensors. Furthermore, the output buffer that may be added to the preamplifier, as disclosed herein, also contributes to considerably less noise when compared to existing art.

While specific language has been used to describe the disclosure, any limitations arising on account of the same are not intended. As would be apparent to a person skilled in the art, various working modifications may be made to the method in order to implement the inventive concept as taught herein.

The figures and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

We claim:

1. A preamplifier circuit for a Micro Electro Mechanical Systems (MEMS) capacitive sensor, the preamplifier circuit comprising:
    a first N-MOSFET connected in common source configuration, for amplifying an output signal of the MEMS capacitive sensor;
    a first P-MOSFET;
    a first capacitor and a second capacitor, wherein the first capacitor is connected between a source terminal of the first P-MOSFET and a bias node of the MEMS capacitive sensor, and the second capacitor is connected between the bias node of the MEMS capacitive sensor and a source terminal of the first N-MOSFET, wherein the first capacitor and the second capacitor are configured to set the gain of the preamplifier circuit greater than one;
    a first current source connected to the drain terminal of the first N-MOSFET; and
    a gate voltage compensation circuit for eliminating dependence of a voltage at the drain terminal of the first N-MOSFET on temperature and process gradients across the silicon die of the first N-MOSFET and for keeping the first N-MOSFET in saturation, the gate voltage compensation circuit comprising:
    a plurality of second current sources and current sinks for establishing a current flow through the first N-MOSFET;
    a second N-MOSFET designed to carry a current proportional to the current carried by the first N-MOSFET, wherein the second N-MOSFET is a scaled-down version of the first N-MOSFET;
    a first resistor and a second resistor for establishing the voltage at the drain terminal of the first N-MOSFET; and
    a first biasing resistor connected between the second resistor and a gate terminal of first N-MOSFET, wherein the resistance of the first biasing resistor is high compared to the second resistor, wherein the first biasing resistor and total capacitance at the gate terminal of the first N-MOSFET act as a low pass filter, having a cutoff frequency low enough to avoid interferences of gate voltage compensation circuit in the audio frequency range; and
    an output buffer for buffering the voltage at the drain terminal of the first N-MOSFET.

2. The preamplifier circuit as claimed in claim 1, wherein the output buffer comprises:
    a second P-MOSFET, wherein a drain terminal and a gate terminal of the second P-MOSFET are shorted;
    a third N-MOSFET connected in source follower configuration, wherein source terminal of the third N-MOSFET is connected to the source terminal of the first P-MOSFET and a source terminal of the second P-MOSFET, and wherein a drain terminal and a gate terminal of the second P-MOSFET are shorted;
    a second biasing resistor connected between a drain terminal and a gate terminal of the third N-MOSFET;
    a third biasing resistor connected between a gate terminal of the first P-MOSFET and the gate terminal of the second P-MOSFET, for biasing the first P-MOSFET;
    a current sink connected from the gate terminal of the second P-MOSFET to the source terminal of the first N-MOSFET; and
    a first capacitor connected between a drain terminal of first N-MOSFET and a gate terminal of the third N-MOSFET, for driving the third N-MOSFET, and a second capacitor connected between the drain terminal of first N-MOSFET and the gate terminal of the first P-MOSFET, for driving the first P-MOSFET, wherein the first P-MOSFET and the third N-MOSFET together act as a push-pull buffer, and wherein output of the preamplifier circuit is measured at the source terminal of the first P-MOSFET.

3. The preamplifier circuit as claimed in claim 1, wherein the first current source and the plurality of second current sources and current sinks generate constant currents and sinks constant currents respectively.

4. The preamplifier circuit as claimed in claim 1, wherein the first capacitor is configured between an output node of the preamplifier circuit and the gate terminal of the first N-MOSFET for a gain lesser than or greater than one.

* * * * *